(12) United States Patent
Huang et al.

(10) Patent No.: US 10,529,857 B2
(45) Date of Patent: Jan. 7, 2020

(54) SIGE SOURCE/DRAIN STRUCTURE (71) Applicant: SHANGHAI HUALI MICROELECTRONICS CORPORATION, Shanghai (CN)

(72) Inventors: Qiuming Huang, Shanghai (CN); Jun Tan, Shanghai (CN); Qiang Yan, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 16/112,640

(22) Filed: Aug. 24, 2018

(65) Prior Publication Data

US 2018/0366584 A1    Dec. 20, 2018

Related U.S. Application Data

(62) Division of application No. 15/390,528, filed on Dec. 25, 2016, now Pat. No. 10,134,900.

(30) Foreign Application Priority Data

Dec. 1, 2016  (CN) .......................... 2016 1 1093086

(51) Int. Cl.
*H01L 29/78*    (2006.01)
*H01L 21/8234*  (2006.01)
(Continued)

(52) U.S. Cl.
CPC ...... *H01L 29/7848* (2013.01); *H01L 21/0245* (2013.01); *H01L 21/0262* (2013.01);
(Continued)

(58) Field of Classification Search
CPC ......... H01L 21/02532; H01L 29/66636; H01L 29/7848; H01L 29/0847; H01L 21/02639;
(Continued)

(56) References Cited

U.S. PATENT DOCUMENTS 8,853,060 B1 * 10/2014 Lai .................... H01L 21/02532
                                                      438/478
2012/0056245 A1 * 3/2012 Kang ................. H01L 21/0245
                                                      257/192

(Continued)

*Primary Examiner* — Brian Turner
(74) *Attorney, Agent, or Firm* — Tianchen LLC; Yuan R. Li; Yi Fan Yin (57) ABSTRACT

A structure of SiGe source/drain and a preparation method thereof are disclosed in the present invention. Firstly, providing a semiconductor single crystal silicon substrate. Secondly, etching the semiconductor single crystal silicon substrate to form recesses on both sides of the gate. Thirdly, epitaxially growing a SiGe seed layer and a SiGe bulk layer in the recesses in turn. Fourthly, subjecting the SiGe bulk layer to a crystal plane treatment with a mixed-gases. Fifthly, epitaxially growing a lattice change layer on the SiGe bulk layer. Finally, epitaxially growing a cap layer on the lattice change layer. The preparation method of the present invention can greatly improve the morphology of the SiGe epitaxy in the incomplete Un-tuck structure, and promote the formation of the subsequent metal silicide (NiSi), so that problems such as abnormal resistance and leakage of active area (AA leakage) can be effectively prevented.

4 Claims, 6 Drawing Sheets

(51) Int. Cl.
*H01L 29/66* (2006.01)
*H01L 29/165* (2006.01)
*H01L 29/49* (2006.01)
*H01L 29/04* (2006.01)
*H01L 29/06* (2006.01)
*H01L 29/40* (2006.01)
*H01L 21/02* (2006.01)
*H01L 21/306* (2006.01)

(52) U.S. Cl.
CPC .. *H01L 21/02381* (2013.01); *H01L 21/02532* (2013.01); *H01L 21/02579* (2013.01); *H01L 21/30604* (2013.01); *H01L 21/823418* (2013.01); *H01L 29/045* (2013.01); *H01L 29/0653* (2013.01); *H01L 29/165* (2013.01); *H01L 29/401* (2013.01)

(58) Field of Classification Search
CPC ............. H01L 21/0237; H01L 21/0245; H01L 21/02579; H01L 21/0262; H01L 29/165
See application file for complete search history.

(56) References Cited

U.S. PATENT DOCUMENTS

| | | | |
|---|---|---|---|
| 2012/0168821 A1* | 7/2012 | Cheng | H01L 21/823412 257/192 |
| 2013/0244389 A1* | 9/2013 | Cheng | H01L 21/823412 438/285 |
| 2013/0252392 A1* | 9/2013 | Cheng | H01L 21/02381 438/300 |
| 2016/0181427 A1* | 6/2016 | Hsiao | H01L 29/66515 257/192 |

* cited by examiner

SIGE SOURCE/DRAIN STRUCTURE

CROSS-REFERENCE TO RELATED APPLICATION

This application is a divisional application of U.S. application Ser. No. 15/390,528 filed Dec. 25, 2016, which claims the priority benefit of China patent application serial No. 201611093086.2, filed Dec. 1, 2016. The entire contents of the above-mentioned patent application are hereby incorporated by reference herein and made a part of the specifications.

FIELD OF THE INVENTION

The present invention relates to semiconductor silicon wafer process in the field of IC manufacturing technology, and particularly to a structure and preparation of SiGe source/drain.

BACKGROUND OF THE INVENTION

With the development of the IC manufacturing technology, the size of field effect transistor (FET) has been reducing. So, strain technology has been introduced to change lattice structure of channel for improving the carrier mobility in a channel. It has been known from the existing studies that the application of tensile stress in the channel can increase the electron mobility, while the application of compressive stress can increase the hole mobility.

Since the semiconductor manufacturing technology has been developed into the nano-scale, scaling down technology is facing more and more serious challenges. New technologies are needed to enhance the performance of the FET, of which strained silicon technology has been widely used, especially the application of embedded SiGe technology.

In the embedded SiGe technology, SiGe compound is embedded into the source region and the drain region to provide a compressive stress to the channel, so as to greatly improve the performance of the PMOS.

Figure 1:
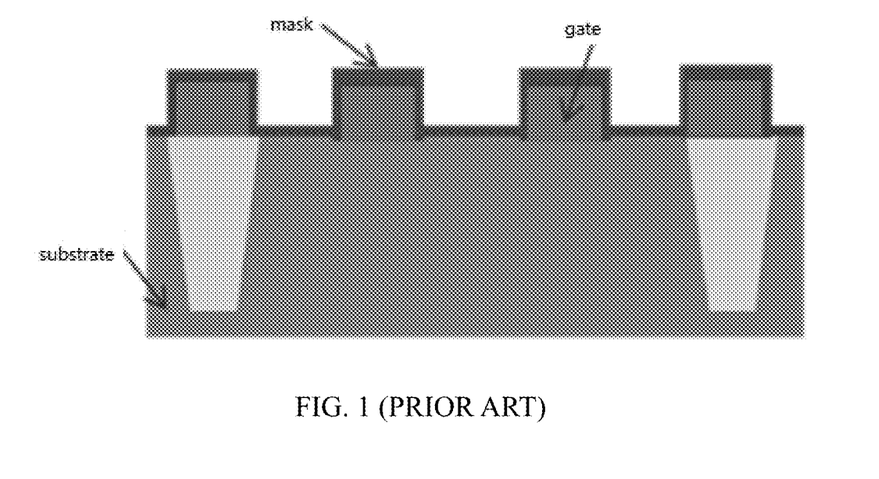
FIG. 1 is a sectional view of SiGe source/drain after finishing the Step S01 of preparation method of SiGe source/drain in the prior art.
Figure 2:
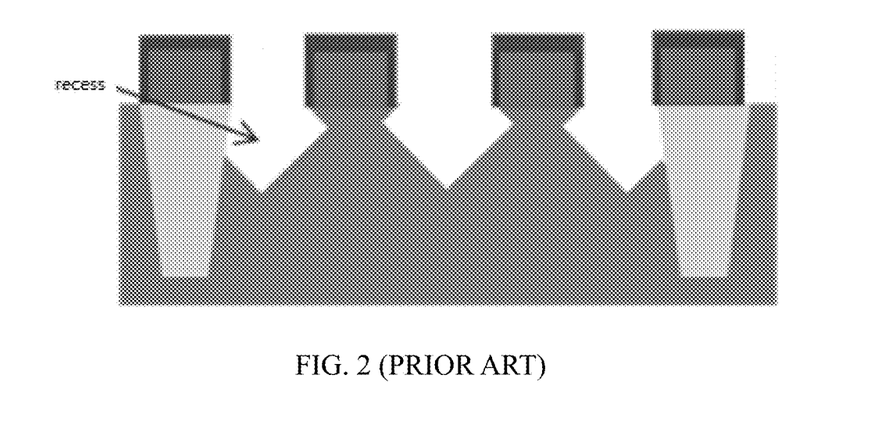
FIG. 2 is a sectional view of SiGe source/drain after finishing the Step S02 of preparation method of SiGe source/drain in the prior art.
Figure 3:
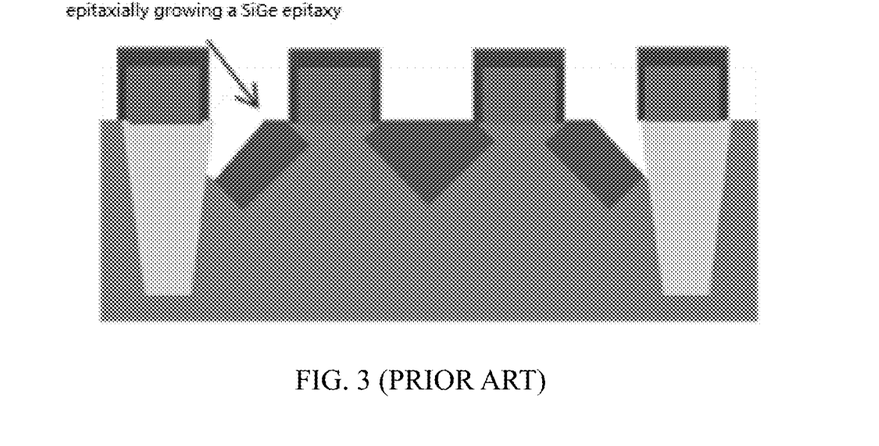
FIG. 3 is a sectional view of SiGe source/drain after finishing the Step S03 of preparation method of SiGe source/drain in the prior art.

Referring to the FIGS. 1-4, a method of preparing SiGe source/drain in the prior art is described, which comprises the steps of:

Step S01: providing a semiconductor single crystal silicon substrate, and preparing a gate and a mask on the semiconductor single crystal silicon substrate (shown in the FIG. 1); wherein, the semiconductor single crystal silicon substrate can be a SOI substrate;

Step S02: patterning etching the semiconductor single crystal silicon substrate to form recesses (shown in the FIG. 2);

Step S03: epitaxially growing a SiGe seed layer and a SiGe bulk layer in the recesses of the semiconductor single crystal silicon substrate in turn;

Specifically, in the embedded SiGe technology, due to epitaxial growth has crystal orientation selectivity (such as, epitaxial growth is the fastest in the <100> crystal orientation, faster in the <110> crystal orientation, and almost impossible in the <111> crystal orientation), the <111> crystal plane of the SiGe epitaxy in the un-tuck structure more easily formed at the area near the STI structure will restrain the growth of the SiGe seed layer and the SiGe bulk layer, so cause the insufficient of thickness of the SiGe seed layer and the SiGe bulk layer, as shown in the FIG. 3.

Figure 4:
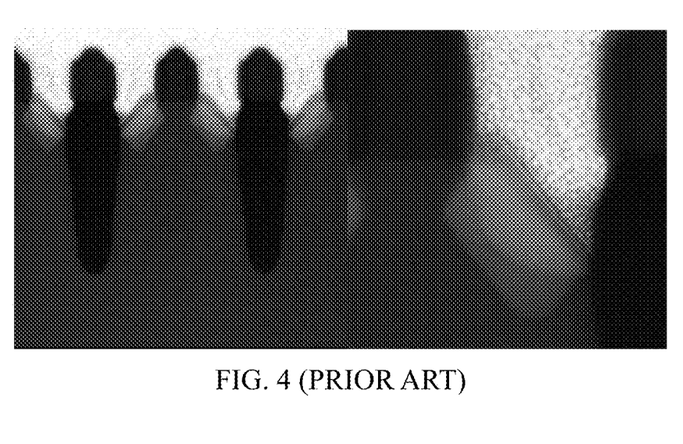
FIG. 4 is a photo sectional view of SiGe source/drain after finishing the Step S04 of preparation method of SiGe source/drain in the prior art.

Step S04: epitaxially growing a cap layer on top of the SiGe seed layer and the SiGe bulk layer.

Specifically, the formed <111> crystal plane at the Step S03 also restrains the growth of the cap layer, so the cap layer grown on the <111> crystal plane in the un-tuck structure becomes uneven as shown in the FIG. 4. In other words, the thickness of the cap layer grown on the <111> crystal plane is insufficient.

It is well known by the person skilled in the art that, in the subsequent metal silicide reaction, Ni atom is easy to infiltrate into the bottom semiconductor single crystal silicon substrate, so that lead to the leakage of the active area. In addition, SiGe epitaxy with high germanium concentration is difficult to react with Ni to form metal silicide (NiSi or NiGeSi), so that cause poor contact between subsequent contact hole and the SiGe epitaxy, and further cause leakage, increased resistance and uncontrolled resistance, and so on.

BRIEF SUMMARY OF THE DISCLOSURE

To overcome the problems as mentioned above, it is an object of the present invention to provide a structure of SiGe source/drain and a preparation method thereof, which can greatly improve the morphology of the SiGe epitaxy in the incomplete Un-tuck structure, and promote the formation of the subsequent metal silicide (NiSi), so that problems such as abnormal resistance and leakage of active area (AA leakage) can be effectively prevented.

To achieve above object, the solution of the present invention is as follows:

A structure of SiGe source/drain, comprising: a semiconductor single crystal silicon substrate, having a prepared gate and two recesses on both sides of the gate respectively; a SiGe seed layer and a SiGe bulk layer, epitaxially grown in the recesses in turn, and the SiGe bulk layer is subjected to a crystal plane treatment with a mixed-gases; the crystal plane treatment comprises simultaneous etching of the SiGe bulk layer surface and growth of a new SiGe bulk layer, wherein, the etching rate of the SiGe bulk layer surface is larger than the growth rate of the new SiGe bulk layer; the mixed gases include $SiH_4$, $SiH_2Cl_2$, HCl, $H_2$, $B_2H_6$ and $GeH_4$; a lattice change layer, epitaxially grown on the top of the treated SiGe bulk layer and located in the recesses or on the top surface of the recesses; the growth of the lattice change layer comprises simultaneous etching of the SiGe bulk layer surface and growth of the lattice change layer, wherein, the etching rate of the SiGe bulk layer surface is smaller than the growth rate of the lattice change layer; and a cap layer, epitaxially grown on the top surface of the lattice change layer and the SiGe bulk layer.

Preferably, the upper surface of the lattice change layer is level with the upper surface of the semiconductor single crystal silicon substrate.

Preferably, the material of the lattice change layer is SiGe.

Preferably, the germanium concentration in the lattice change layer is lower than the germanium concentration in the SiGe bulk layer.

To achieve above object, another solution of the present invention is also as follows:

A method of preparing SiGe source/drain, comprising the steps of:

Step S1: providing a semiconductor single crystal silicon substrate, and preparing a gate on the semiconductor single crystal silicon substrate;

Step S2: etching the semiconductor single crystal silicon substrate to form recesses on both sides of the gate;

Step S3: epitaxially growing a SiGe seed layer and a SiGe bulk layer in the recesses in turn;

Step S4: subjecting the SiGe bulk layer to a crystal plane treatment with a mixed-gases; the crystal plane treatment comprises simultaneous etching of the SiGe bulk layer surface and growth of a new SiGe bulk layer, wherein, the etching rate of the SiGe bulk layer surface is larger than the growth rate of the new SiGe bulk layer; the mixed gases include $SiH_4$, $SiH_2Cl_2$, HCl, $H_2$, $B_2H_6$ and $GeH_4$;

Step S5: epitaxially growing a lattice change layer on the top of the treated SiGe bulk layer; the growth of the lattice change layer comprises simultaneous etching of the SiGe bulk layer surface and growth of the lattice change layer, wherein, the etching rate of the SiGe bulk layer surface is smaller than the growth rate of the lattice change layer;

Step S6: epitaxially growing a cap layer on the top surface of the lattice change layer and the SiGe bulk layer.

Preferably, in the Step S4, the flow rate of $H_2$ is 1000 sccm-60000 sccm; the flow rate of HCl is 1 sccm-400 sccm; the flow rate of $GeH_4$ is 0-500 sccm; the flow rate of $SiH_2Cl_2$ is 0.1 sccm-500 sccm; the flow rate of $B_2H_6$ is 0-200 sccm; the gas flow ratio of $SiH_2Cl_2$ to $SiH_4$ & HCl & $B_2H_6$ & $GeH_4$ is between 1:0.01 and 1:200.

Preferably, in the Step S4, the reaction temperature is 500° C. to 900° C., and the pressure in the reaction chamber is 1 Torr to 100 Torr.

Preferably, in the Step S5, the reaction gases used to grow the lattice change layer include $SiH_4$, $SiH_2Cl_2$, HCl, $H_2$, $GeH_4$, and $B_2H_6$.

Preferably, in the Step S5, the flow rate of $H_2$ is 1000 sccm-60000 sccm; the flow rate of $GeH_4$ is 1 sccm-900 sccm; the flow rate of $SiH_2Cl_2$ is 1 sccm-600 sccm; the flow rate of HCl is 1 sccm-500 sccm; the flow rate of $B_2H_6$ is 1 sccm-600 sccm; the gas flow ratio of $GeH_4$ to $SiH_2Cl_2$ & $SiH_4$ & HCl & $B_2H_6$ is between 1:0.01 and 1:200.

Preferably, the upper surface of the lattice change layer is level with the upper surface of the semiconductor single crystal silicon substrate.

Preferably, the material of the lattice change layer is SiGe.

Preferably, the germanium concentration in the lattice change layer is lower than the germanium concentration in the SiGe bulk layer.

To achieve above object, a structure of SiGe source/drain prepared according to the above-mentioned method is also disclosed, comprising: a semiconductor single crystal silicon substrate, having a prepared gate and recesses on both sides of the gate; a SiGe seed layer and a SiGe bulk layer, epitaxially grown in the recesses in turn, and the SiGe bulk layer is subjected to a crystal plane treatment with a mixed-gases to destroy the <111> crystal plane of the SiGe bulk layer; the crystal plane treatment comprises simultaneous etching of the SiGe bulk layer surface and growth of a new SiGe bulk layer, wherein, the etching rate of the SiGe bulk layer surface is larger than the growth rate of the new SiGe bulk layer; a lattice change layer, epitaxially grown on the top of the treated SiGe bulk layer and located in the recesses or on the top surface of the recesses; the growth of the lattice change layer comprises simultaneous etching of the SiGe bulk layer surface and growth of the lattice change layer, wherein, the etching rate of the SiGe bulk layer surface is smaller than the growth rate of the lattice change layer; and a cap layer, epitaxially grown on the top surface of the lattice change layer and the SiGe bulk layer.

Preferably, the material of the lattice change layer is SiGe.

Concluded from the above solutions, the present invention has increased the Step S4 and the Step S5 in comparison to the prior art to greatly improve the morphology of the SiGe epitaxy in the incomplete un-tuck structure. The added lattice change layer has solved the problem of insufficient of the growth of the SiGe bulk layer, which not only can increase the stress in the channel, but also can avoid the subsequent grown NiSi infiltrating into the bottom semiconductor single crystal silicon substrate. In addition, the lattice change layer has changed the crystal orientation of the <111> crystal plane of the SiGe bulk layer, which can promote the growth of the cap layer, improve the morphology of the cap layer, and enhance the thickness and uniformity of the SiGe cap layer located at the <111> crystal plane of the un-tuck structure, so that promote the formation of the subsequent metal silicide (NiSi), and effectively prevent the problems such as abnormal resistance and leakage of active area (AA leakage) caused by the Ni infiltration into the bottom semiconductor single crystal silicon substrate.

DETAILED DESCRIPTION OF THE EMBODIMENTS

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it should be avoided to understand this as a limitation to the present invention.

Compared with the prior art, the same with the prior art, structure of SiGe source/drain of the present invention comprises a semiconductor single crystal silicon substrate, a SiGe seed layer and a SiGe bulk layer, and a cap layer. Wherein, the semiconductor single crystal silicon substrate has a prepared gate and two recesses on both sides of the gate, respectively. The SiGe seed layer and the SiGe bulk layer epitaxially grow in the recesses in turn.

Compared with the prior art, the different from the prior art, between the SiGe bulk layer and the cap layer, structure of SiGe source/drain of the present invention also comprises a lattice change layer epitaxially grown on the top of the SiGe bulk layer and located in the recesses or on the top surface of the recesses. The cap layer epitaxially grows on the top surface of the lattice change layer and the SiGe bulk layer.

Preferably, the material of the lattice change layer is SiGe. The Ge concentration in the lattice change layer may be lower than that in the SiGe seed layer and the SiGe bulk layer.

In order to solve the problem of no reaction of SiGe epitaxy with high germanium concentration with Ni, causing poor contact between subsequent contact hole and the SiGe epitaxy, and further causing leakage, increased resistance and uncontrolled resistance, the top surface of the SiGe bulk layer of the present invention also need to undergo a crystal plane treatment step with a mixed-gases, wherein, the mixed gas comprise $SiH_4$, $SiH_2Cl_2$, HCl, $H_2$, $B_2H_6$ and $GeH_4$.

Figure 5:
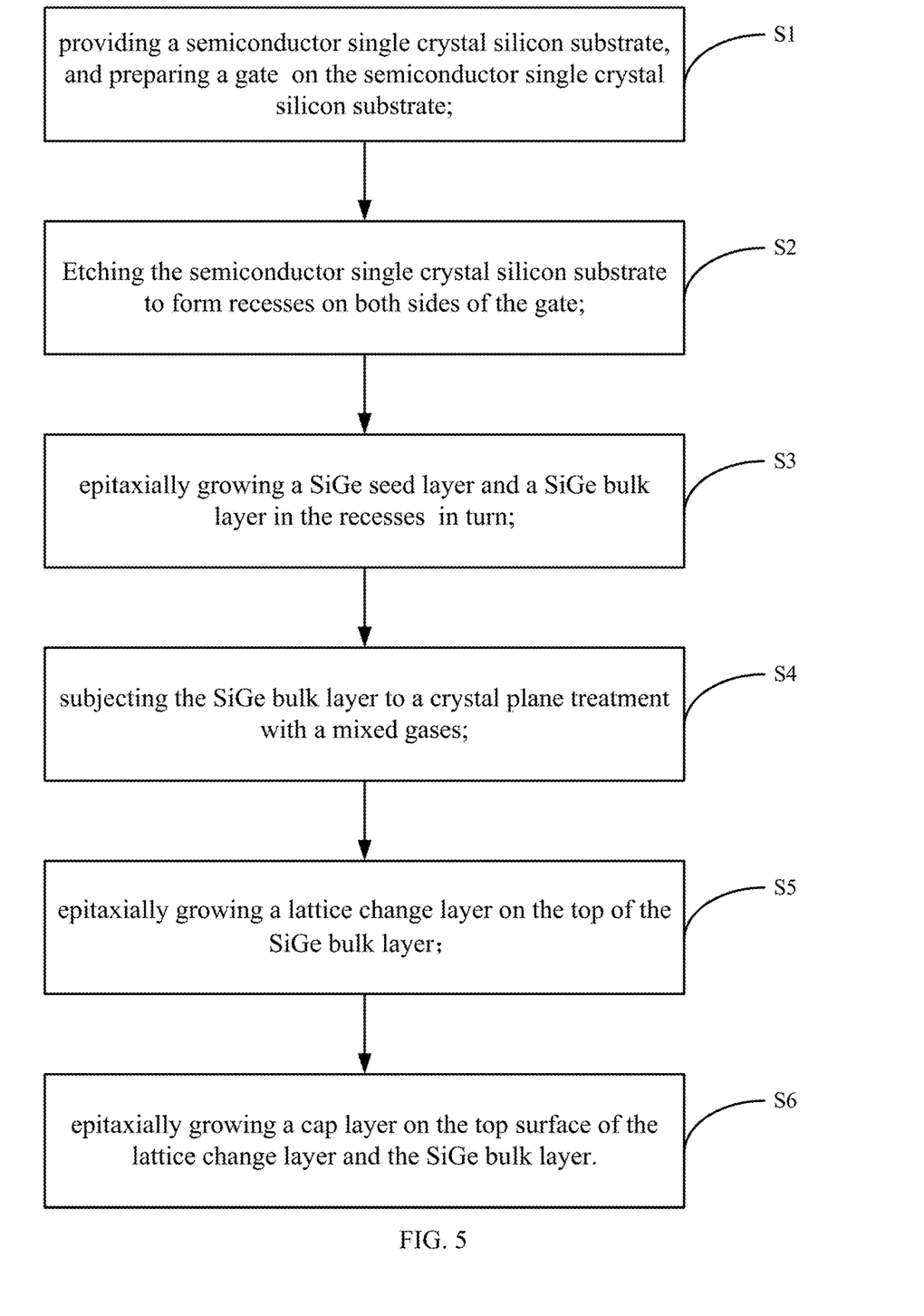
FIG. 5 is a flow sheet illustrating a preparation method of SiGe source/drain according to an embodiment of the present invention.
Figure 6:
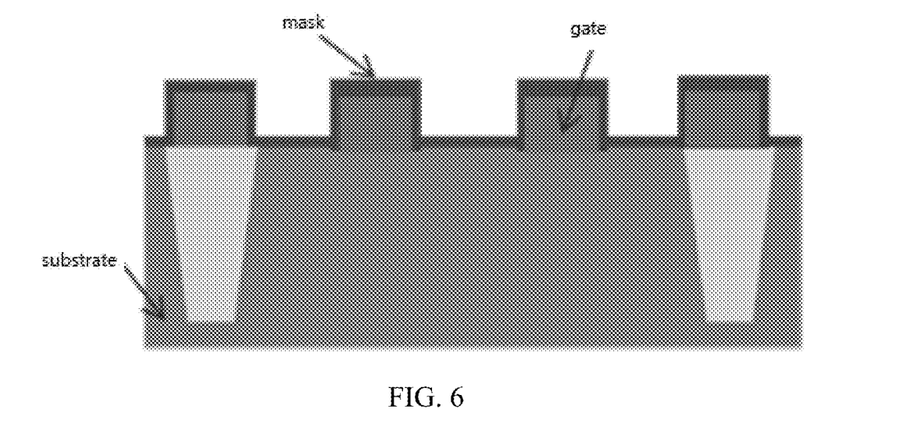
FIG. 6 is a sectional view of SiGe source/drain after finishing the Step S1 of preparation method of SiGe source/drain in the present invention.

Referring to the FIG. 5, which is a flow sheet illustrating a preparation method of SiGe source/drain according to an embodiment of the present invention. As shown in the FIG. 5, a method of preparing SiGe source/drain in the present invention, comprises the steps of:

Step S1: providing a semiconductor single crystal silicon substrate, and preparing a gate on the semiconductor single crystal silicon substrate (shown in the FIG. 6).

In this step, the semiconductor single crystal silicon substrate may be a SOI substrate.

Figure 7:
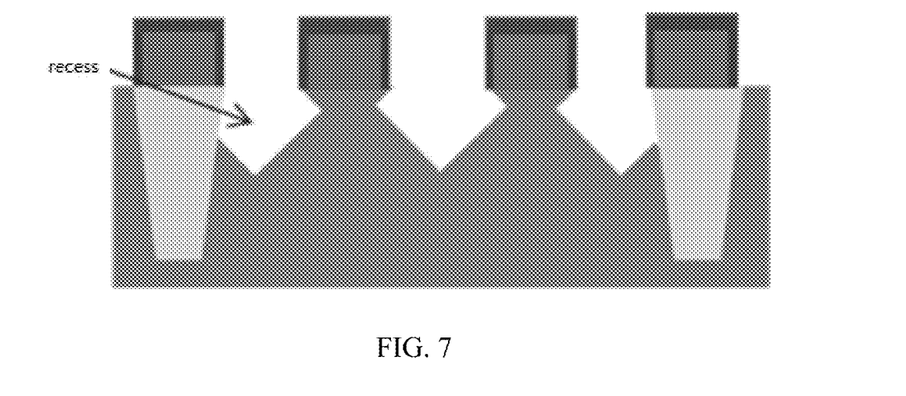
FIG. 7 is a sectional view of SiGe source/drain after finishing the Step S2 of preparation method of SiGe source/drain in the present invention.

Step S2: etching the semiconductor single crystal silicon substrate to form recesses on both sides of the gate (shown in the FIG. 7).

Figure 8:
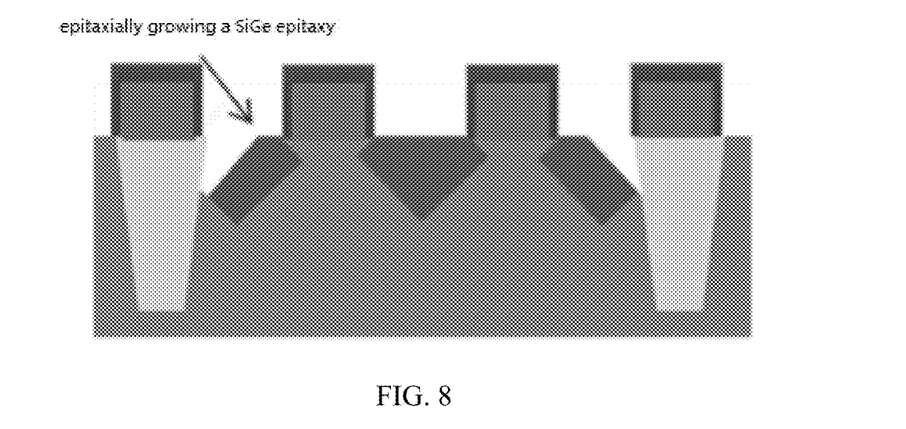
FIG. 8 is a sectional view of SiGe source/drain after finishing the Step S3 of preparation method of SiGe source/drain in the present invention.

Step S3: epitaxially growing a SiGe seed layer and a SiGe bulk layer in the recesses in turn (shown in the FIG. 8).

Specifically, the embedded SiGe technology in the Steps S1, S2 and S3 described above can be carried out using the same method as those in the prior art, and will not be repeated here.

Referring to the FIG. 8, apparently, the same defects as those of the prior art have arisen. Due to epitaxial growth has crystal orientation selectivity (such as, epitaxial growth is the fastest in the <100> crystal orientation, faster in the <110> crystal orientation, and almost impossible in the <111> crystal orientation), the <111> crystal plane of the SiGe epitaxy in the un-tuck structure more easily formed at the area near the STI structure will restrain the growth of the SiGe seed layer and the SiGe bulk layer, so cause the insufficient of the SiGe seed layer and the SiGe bulk layer.

Figure 9:
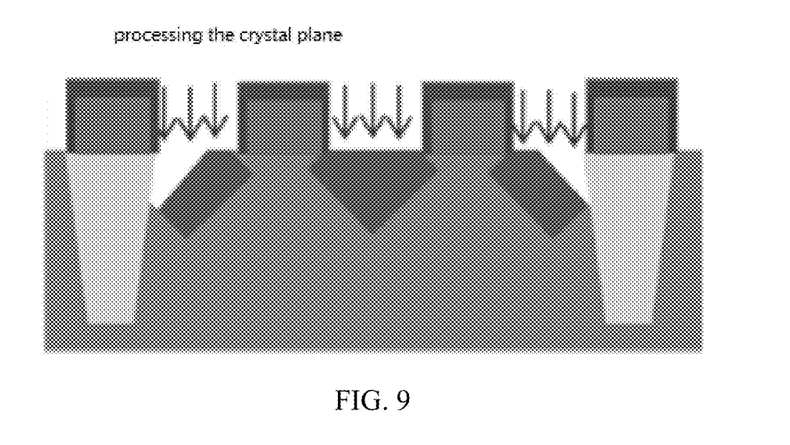
FIG. 9 is a sectional view of SiGe source/drain after finishing the Step S4 of preparation method of SiGe source/drain in the present invention.

In the embodiment, in order to eliminate the adverse influence of the <111> crystal plane generated in the Step S3 on the growth of the subsequent cap layer, and to improve the uniformity of the SiGe cap layer on the <111> crystal plane in the incomplete un-tuck structure, the following two steps are added:

Step S4: subjecting the SiGe bulk layer to a crystal plane treatment with a mixed-gases to destroy the <111> crystal plane of the SiGe bulk layer; the crystal plane treatment comprises simultaneous etching of the SiGe bulk layer surface and growth of a new SiGe bulk layer, wherein, the etching rate of the SiGe bulk layer surface is larger than the growth rate of the new SiGe bulk layer; the mixed gases include $SiH_4$, $SiH_2Cl_2$, HCl, $H_2$, $B_2H_6$ and $GeH_4$.

In this step, the reaction is carried out under the $H_2$ atmosphere. The HCl gas is used to etch the <111> crystal plane of the SiGe bulk layer, which aimed to destroy the <111> crystal orientation. In order to prevent the excessive etching of the HCl gas from causing damage to the SiGe bulk layer, it is necessary to perform an SiGe epitaxial growth while etching. So, the SiGe epitaxial growth is carried out by the reaction of $GeH_4$ with $SiH_2Cl_2$ (or $SiH_4$ or Si source mixed gases by $SiH_2Cl_2$ and $SiH_4$). The $B_2H_6$ gas serves as a dopant gas and functions as a dopant in the SiGe bulk layer, which aims to increase the growth rate of the SiGe bulk layer. It is required that the etch rate is slightly higher than the growth rate. As a result, the <111> crystal plane of the shallow surface of the SiGe bulk layer is destroyed, but the inside of the SiGe bulk layer is not damaged. After treating the crystal plane, crystal orientation of the <111> crystal plane generated in the Step S3 has been changed, which makes it possible to epitaxially grow a lattice change layer with a certain thickness on the SiGe bulk layer and grow a cap layer epitaxially on the lattice change layer. Further, the uniform growth of the lattice change layer and the cap layer also ensures the thickness of the cap layer.

Preferably, in the Step S4, the flow rate of $H_2$ is 1000 sccm-60000 sccm; the flow rate of HCl is 1 sccm-400 sccm; the flow rate of $GeH_4$ is 0-500 sccm; the flow rate of $SiH_2Cl_2$ is 0.1 sccm-500 sccm; the flow rate of $B_2H_6$ is 0-200 sccm; the flow rate ratio of $SiH_2Cl_2$ and $SiH_4$ & HCl & $B_2H_6$ & $GeH_4$ is between 1:0.01 and 1:200. The reaction temperature in the Step S4 is 500° C. to 900° C., and the pressure in the reaction chamber is 1 Torr to 100 Torr.

Step S5: epitaxially growing a lattice change layer on the top of the treated SiGe bulk layer (shown in the FIG. 10); the growth of the lattice change layer comprises simultaneous etching of the SiGe bulk layer surface and growth of the lattice change layer, wherein, the etching rate of the SiGe bulk layer surface is smaller than the growth rate of the lattice change layer.

Figure 10:
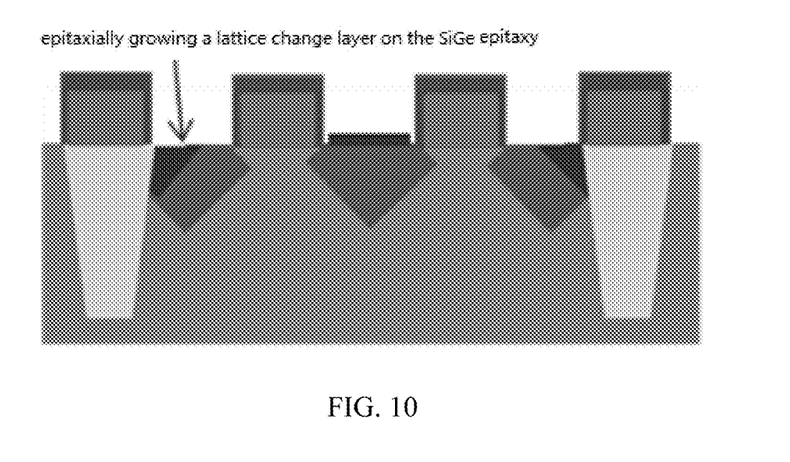
FIG. 10 is a sectional view of SiGe source/drain after finishing the Step S5 of preparation method of SiGe source/drain in the present invention.

In this step, the reaction gases growing the lattice change layer include $SiH_4$, $SiH_2Cl_2$, HCl, $H_2$, $GeH_4$, and $B_2H_6$. The reaction is also carried out under the $H_2$ atmosphere. The etching of the SiGe bulk layer surface and the growth of the lattice change layer are simultaneously performed. The $GeH_4$ and $SiH_2Cl_2$ (or $SiH_4$ or Si source mixed gases by $SiH_2Cl_2$ and $SiH_4$) are employed to react to generate the SiGe. The $B_2H_6$ gas serves as a dopant gas and functions as a dopant in the SiGe bulk layer, which aims to increase the growth rate of the lattice change layer. The HCl gas is used as an etching gas for the purpose of selective growth of single crystals and poly crystals to change the undesirable <111> crystal plane. Preferably, the flow rate of $H_2$ is 1000 sccm-60000 sccm; the flow rate of $GeH_4$ is 1 sccm-900 sccm; the flow rate of $SiH_2Cl_2$ is 1 sccm-600 sccm; the flow rate of HCl is 1 sccm-500 sccm; the flow rate ratio of $GeH_4$ and $SiH_2Cl_2$ & $SiH_4$ & HCl & $B_2H_6$ is between 1:0.01 and 1:200. Usually, the Ge concentration in the lattice change layer may be lower than that in the SiGe seed layer and the SiGe bulk layer. The material of the lattice change layer is SiGe.

Figure 11:
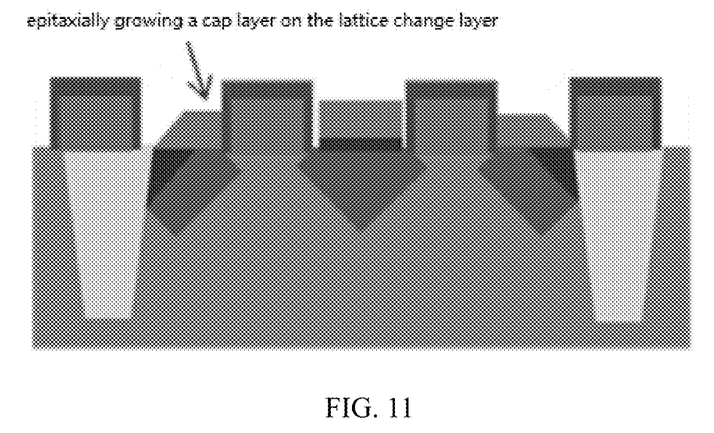
FIG. 11 is a sectional view of SiGe source/drain after finishing the Step S6 of preparation method of SiGe source/drain in the present invention.

Step S6: epitaxially growing a cap layer on the top surface of the lattice change layer and the SiGe bulk layer (shown in the FIG. 11).

Figure 12:
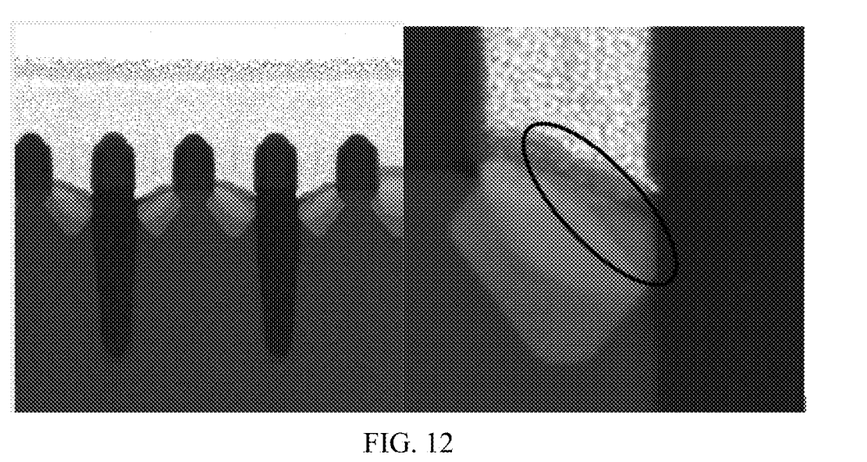
FIG. 12 is a photo sectional view of SiGe source/drain after finishing the preparation of SiGe source/drain in the present invention.

Referring to the FIG. 12, which is a photo sectional view of SiGe source/drain after finishing the preparation of SiGe source/drain in the present invention. As shown in the FIG. 12, by employing the method of the present invention, the morphology of the SiGe epitaxy in the un-tuck structure is greatly improved, and the growth filling degree of the SiGe bulk layer is also greatly improved. It should be noticed that the morphology of the gap layer has also been improved. Therefore, the thickness and uniformity of the cap layer can meet the design requirements. The main material of the cap layer is silicon, or germanium silicon with low germanium concentration.

In summary, in the subsequent metal silicide reaction, if the thickness of the cap layer is sufficient, the problem of the leakage of the active area (AA leakage) caused by Ni leakage into the bottom semiconductor single crystal silicon substrate will not occur. In addition, the SiGe seed layer and the SiGe bulk layer with high germanium concentration is avoided to react with Ni to form a high-resistance phase metal silicide (NiGeSi), so that avoid poor contact between subsequent contact hole and the SiGe epitaxy, and further avoid the problems of the increased resistance and uncontrolled resistance.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A structure of SiGe source/drain, comprising:
a semiconductor single crystal silicon substrate, having a prepared gate and two recesses on both sides of the gate respectively;
an epitaxial SiGe seed layer in the recesses and a treated SiGe bulk layer on the SiGe seed layer; wherein the treated SiGe bulk layer fills up a first recess on a side of the gate which is not adjacent to a STI structure and leaves an unfilled cavity in a second recess on the other side of the gate which is adjacent to a STI structure;
an epitaxial lattice change layer on the top of the treated SiGe bulk layer; wherein the epitaxial lattice change layer is located on the top surface of the first recess filled with the treated SiGe bulk layer and in the unfilled cavity within the second recess;
an epitaxial cap layer on the top surface of the epitaxial lattice change layer and the treated SiGe bulk layer;
wherein the thickness of the epitaxial lattice change layer in the unfilled cavity within the second recess increases from a side near the gate to a side adjacent to the STI structure.

2. The structure according to claim 1, wherein the upper surface of the epitaxial lattice change layer is level with the upper surface of the semiconductor single crystal silicon substrate.

3. The structure according to claim 1, wherein the material of the epitaxial lattice change layer is SiGe.

4. The structure according to claim 3, wherein the germanium concentration in the epitaxial lattice change layer is lower than the germanium concentration in the treated SiGe bulk layer.

* * * * *